United States Patent [19]

Chi et al.

[11] Patent Number: 5,710,446
[45] Date of Patent: Jan. 20, 1998

[54] ACTIVE PIXEL SENSOR CELL THAT UTILIZES A PARASITIC TRANSISTOR TO RESET THE PHOTODIODE OF THE CELL

[75] Inventors: Min-hwa Chi, Palo Alto; Richard Billings Merrill, Daly City; Albert Bergemont, Palo Alto, all of Calif.

[73] Assignee: National Semiconductor Corporation, Santa Clara, Calif.

[21] Appl. No.: 647,687

[22] Filed: May 13, 1996

[51] Int. Cl.⁶ .................. H01L 27/148; H01L 29/768
[52] U.S. Cl. .................................................. 257/225
[58] Field of Search ........................................ 257/225

[56] References Cited

U.S. PATENT DOCUMENTS

| | | |
|---|---|---|
| 4,716,466 | 12/1987 | Miida ............................ 257/225 |
| 4,760,558 | 7/1988 | Berger et al. .................. 257/225 |
| 5,053,872 | 10/1991 | Matsunaga ..................... 257/225 |
| 5,191,398 | 3/1993 | Mutoh ............................ 257/216 |

OTHER PUBLICATIONS

Dickinson, A. et al., "A 256×256 CMOS Active Pixel Image Sensor with Motion Detection", TP 13.5, IEEE International Solid-State Circuits Conference (1995) pp. 226–227.

Primary Examiner—Stephen Meier
Attorney, Agent, or Firm—Limbach & Limbach L.L.P.

[57] ABSTRACT

The amount of silicon real estate consumed by a photodiode-based active pixel sensor cell is reduced by utilizing a parasitic transistor to reset the voltage on the photodiode in lieu of the conventional use of a reset transistor. The parasitic transistor is formed by forming a doped region a distance apart from the well region of the photodiode, which defines a parasitic channel region therebetween, and a reset gate over the parasitic channel region.

9 Claims, 2 Drawing Sheets

5,710,446

ACTIVE PIXEL SENSOR CELL THAT UTILIZES A PARASITIC TRANSISTOR TO RESET THE PHOTODIODE OF THE CELL

BACKGROUND OF THE INVENTION

1. Field of the Invention

The present invention relates to active pixel sensor cells and, more particularly, to an active pixel sensor cell that utilizes a parasitic transistor to reset the photodiode of the cell.

2. Description of the Related Art.

Charge-coupled devices (CCDs) have been the mainstay of conventional imaging circuits for converting a pixel of light energy into an electrical signal that represents the intensity of the light energy. In general, CCDs utilize a photogate to convert the light energy into an electrical charge, and a series of electrodes to transfer the charge collected at the photogate to an output sense node.

Although CCDs have many strengths, which include a high sensitivity and fill-factor, CCDs also suffer from a number of weaknesses. Most notable among these weaknesses, which include limited readout rates and dynamic range limitations, is the difficulty in integrating CCDs with CMOS-based microprocessors.

To overcome the limitations of CCD-based imaging circuits, more recent imaging circuits use active pixel sensor cells to convert a pixel of light energy into an electrical signal. With active pixel sensor cells, a conventional photodiode is typically combined with a number of active transistors which, in addition to forming an electrical signal, provide amplification, readout control, and reset control.

FIG. 1 shows an example of a conventional CMOS active pixel sensor cell 10. As shown in FIG. 1, cell 10 includes a photodiode 12, an n-channel reset transistor 14, whose source is connected to photodiode 12, an n-channel sense transistor 16, whose gate is connected photodiode 12, and an n-channel row select transistor 18, whose drain is connected in series to the source of sense transistor 16.

Operation of active pixel sensor cell 10 is performed in three steps: a reset step, where cell 10 is reset from the previous integration cycle; an image integration step, where the light energy is collected and converted into an electrical signal; and a signal readout step, where the signal is read out.

As shown in FIG. 1, during the reset step, the gate of reset transistor 14 is briefly pulsed with a reset voltage (5 volts) which resets photodiode 12 to an initial integration voltage which is equal to $V_R - V_T$, where $V_R$ represents the reset voltage, and $V_T$ represents the threshold voltage of reset transistor 14.

During integration, light energy, in the form of photons, strikes photodiode 12, thereby creating a number of electron-hole pairs. Photodiode 12 is designed to limit recombination between the newly formed electron-hole pairs. As a result, the photogenerated holes are attracted to the ground terminal of photodiode 12, while the photogenerated electrons are attracted to the positive terminal of photodiode 12 where each additional electron reduces the voltage on photodiode 12.

At the end of the integration period, the final voltage on photodiode 12 is equal to $V_R - V_T - V_S$, where $V_S$ represents the change in voltage due to the absorbed photons. Thus, the number of photons which were absorbed by photodiode 12 during the image integration period can be determined by subtracting the voltage at the end of the integration period from the voltage at the beginning of the integration period, thereby yielding the value $V_S$, i.e., $((V_R - V_T) - (V_R - V_T - V_S))$.

Following the image integration period, active pixel sensor cell 10 is read out by turning on row select transistor 18 (which has been turned off until this point). When row select transistor 18 is turned on, the reduced voltage on photodiode 12 reduces the voltage on the gate of sense transistor 16 which, in turn, reduces the magnitude of the current flowing through transistors 16 and 18. The reduced current level is then detected by conventional current detectors.

One of the principal advantages of active pixel sensor cell 10, in addition to providing amplification and reduced size, is that the fabrication process is inherently CMOS since only MOS transistors are utilized. However, although cell 10 is smaller than conventional CCDs, there is still a need to further reduce the size of active pixel sensor cells.

SUMMARY OF THE INVENTION

Conventionally, the amount of silicon real estate consumed by a photodiode-based active pixel sensor cell is defined, in part, by the size of a reset transistor that is utilized to reset the voltage on the photodiode. In the present invention, the size of the cell is substantially reduced by utilizing a parasitic transistor to reset the voltage on the photodiode in lieu of the reset transistor.

In the present invention, the active pixel sensor cell, which is formed in a semiconductor substrate of a first conductivity type, includes first and second regions, both of a second conductivity type, which are formed in the substrate. The first and second regions are formed a distance apart and define a parasitic channel region therebetween. In addition, the active pixel sensor cell also includes a sense transistor that has a gate connected to the second region, and a row select transistor that is serially connected to the sense transistor to control access to the sense transistor.

In accordance with the present invention, the active pixel sensor cell further includes a reset gate which is formed over the parasitic channel region and isolated therefrom by a layer of insulation material.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
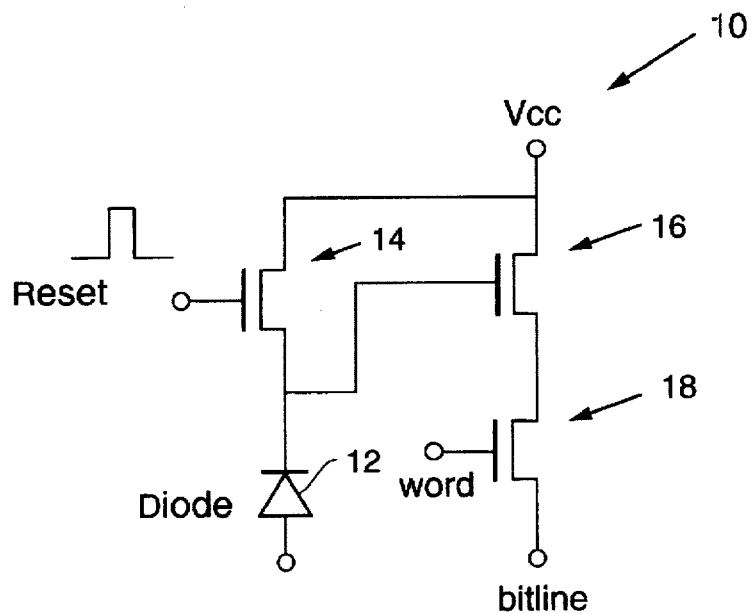
FIG. 1 is a cross-sectional diagram illustrating a conventional active pixel sensor cell 10.
Figure 2:
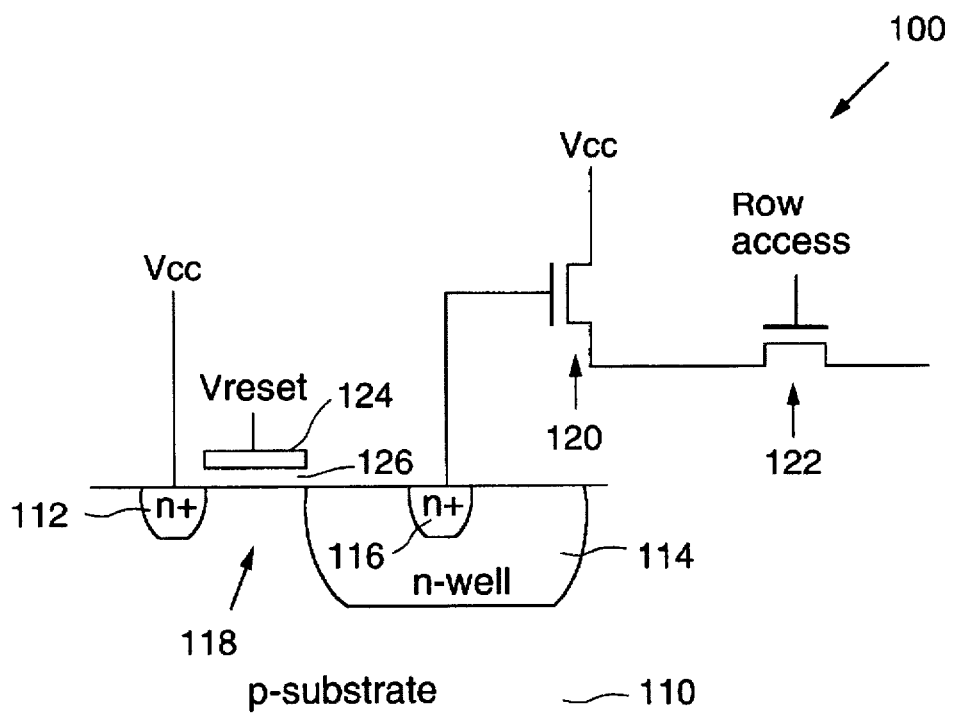
FIG. 2 is a cross-sectional diagram illustrating an active pixel sensor cell 100 in accordance with the present invention.

FIG. 2 shows a cross-sectional diagram of an active pixel sensor cell 100 in accordance with the present invention. As described in greater detail below, cell 100 reduces the silicon real estate consumed by an active pixel sensor cell by utilizing a parasitic transistor to reset the photodiode of cell 100 in lieu of a reset transistor.

As shown in FIG. 2, cell 100 includes an n+ region 112 formed in a p-type semiconductor substrate 110, an n-well 114 formed in substrate 110 a distance apart from n+ region 112, an n+ contact region 116 formed in n-well 114, and a parasitic channel region 118 defined between n+ region 112 and n-well 114.

In addition, cell 100 also includes a sense transistor 120 and a row select transistor 122. As shown, the gate of sense transistor 120 is connected to n+ contact region 116, while the drain of row select transistor 122 is connected to the source of sense transistor 120. In accordance with the present invention, cell 100 further includes a reset gate 124 that is formed over parasitic channel region 118 and isolated therefrom by a layer of gate oxide 126. Reset gate 124 is preferably formed from a layer of conventionally doped polysilicon.

As with conventional active pixel sensor cells, the operation of cell 100 is performed in three steps: a reset step, where cell 100 is reset from the previous integration cycle; an image integration step, where the light energy is collected and converted into an electrical signal; and a signal readout step, where the signal is read out.

During the reset step, the voltage on n-well 114 is reset by utilizing the p-channel parasitic transistor that is formed with n+ region 112, n-well 114, and reset gate 124. Thus, by applying a power supply voltage Vcc to n+ region 112 and reset gate 124, the voltage on n-well 114 will rise to a value which is approximately equal to the power supply voltage Vcc minus the threshold voltage of the parasitic transistor. (Lower voltages which are sufficient to form a conductive channel can also be applied to reset gate 124 at the cost of a reduced dynamic range). Experimental results indicate that n-well 114 is reset in less than one microsecond when a power supply voltage Vcc of five volts is used.

In a first alternative embodiment of the present invention, the power supply voltage Vcc can be charge-pumped to a reset voltage Vreset that is one threshold voltage above the power supply voltage Vcc. The advantage of charge pumping the voltage applied to reset gate 124 is that the charge-pumped voltage allows cell 100 to be insensitive to threshold voltage variations of the parasitic transistor while at the same time allowing cell 100 to obtain the maximum possible dynamic range.

Returning to the operational description, after the voltage on n-well 114 has been reset, n-well 114 is floated by removing the power supply voltage Vcc (or charge-pumped voltage) from reset gate 124 which, in turn, eliminates the conductive channel formed between n+ region 112 and n-well 114. Thus, the junction between p-type substrate 110 and n-well 114 is initially reverse-biased at the beginning of each integration cycle by raising the voltage on n-well 114 with respect to the voltage on substrate 110 which is grounded.

Once the voltage on n-well 114 has been reset, the next step is to begin image integration. During image integration, photons strike the photodiode formed from n-well 114 and p-type substrate 110, thereby creating a number of electron-hole pairs in both n-well 114 and the underlying p-type substrate 110. The number of electron-hole pairs is a function of the intensity of the received light energy.

The photogenerated electrons in n-well 114, in turn, remain in n-well 114, while the electrons formed in p-type substrate 110 diffuse to the p-n junction where they are swept to n-well 114 under the influence of the electric field. Once in n-well 114, the electrons are collected in n+ region 116.

Similarly, the holes formed in n-well 114 diffuse to the p-n junction where they are swept to the p-type substrate 110 under the influence of the electric field. Thus, during each integration period, n-well 114 accumulates the photogenerated electrons for a single pixel.

Therefore, with the addition of each photogenerated electron in n-well 114, the voltage on n+ region 116, which functions as a contact region, is correspondingly reduced. (The depth of the junction as well as the thickness of substrate 110 are designed to limit recombination of the photogenerated electron-hole pairs). As a result, the photodiode varies the voltage on n+ region 116 in a manner which is proportional to the photon absorption rate.

Following the image integration period, active pixel sensor cell 100 is read out by turning on row select transistor 122 (which has been turned off until this point). When row select transistor 122 is turned on, the reduced voltage on n-well 114 reduces the voltage on the gate of sense transistor 120 which, in turn, reduces the magnitude of the current flowing through transistors 120 and 122. The reduced current level is then detected by conventional current detectors.

In addition, when n-well 114 is exposed to very bright light, the present invention automatically provides anti-blooming control, which limits the minimum potential that n-well 114 can reach, when substrate 110 becomes forward-biased with respect to n-well 114. Thus, when the voltage on n-well 114 falls to approximately −0.7 volts, the p-n junction becomes forward-biased thereby allowing any excess electrons to flow to substrate 110. As a result, the maximum dynamic range (with a charge-pumped voltage) extends from approximately −0.7 volts to the power supply voltage Vcc.

Figure 3:
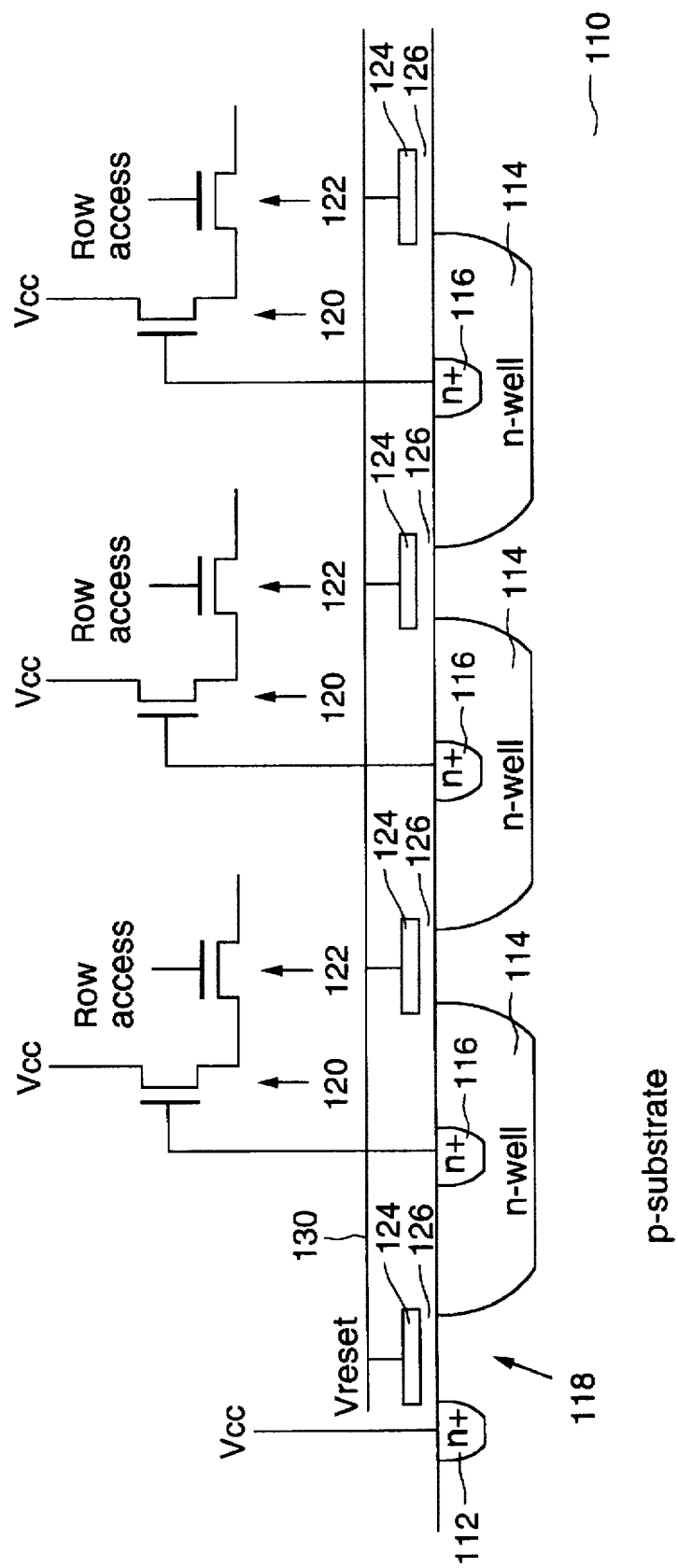
FIG. 3 is a cross-sectional diagram illustrating a row of three active pixel sensor cells 100.

Further, a row of active pixel sensor cells can be formed as part of an array by adding an n-well (plus n+ contact region), a reset gate (plus underlying insulation layer), a sense transistor, and a row select transistor for each additional active pixel sensor cell. FIG. 3 shows a cross-sectional diagram that illustrates a row of three active pixel sensors cells 100.

As shown in FIG. 3, only one n+ region 112 needs to be used for each row of active pixel sensor cells. Optionally, a second n+ region can be formed on the opposite end of the row to reduce the reset time. Thus, when the power supply voltage Vcc is applied to n+ region 112, and the power supply voltage Vcc or the charge-pumped voltage is applied to all of the reset gates 124 in the row via a reset gate line 130, all of the n-wells 114 in the row are reset at the same time.

As a result, the voltage on each of the n-wells 114 will rise to a value which is approximately equal to one threshold voltage drop below the power supply voltage Vcc, or the power supply voltage Vcc when a charge-pumped voltage is used on reset line 130.

Following this, photogenerated electrons are accumulated in each of the n-wells 114 and collected in the corresponding n+ regions 116 as described above. Next, a read voltage is simultaneously applied to the gates of each of the row select transistors 122 to detect the current level output from each of the row select transistors 122. The current level can be detected once or, optionally, multiple times and then averaged. The advantage of averaging the current levels obtained from multiple detections is that read errors may be reduced.

In addition, rather than reading an entire row of cells 100 at the same time, individual cells can be randomly accessed by controlling which row select transistors are turned on.

As noted above, all of the reset gates 124 in one row are connected together via a reset line 130. Reset line 130, which is preferably formed from conventionally doped polysilicon, can be metal strapped to reduce the poly line RC delay. The reset time, however, is mainly limited by the resistance of n-well 114 (approximately 2 kohm/sq) and the n-well 114 to substrate 110 capacitance.

Thus, in accordance with the present invention, an active pixel sensor cell has been described where a parasitic transistor is utilized to replace the reset transistor that is conventionally used to reset the photodiode. As a result, cell 100 can be formed to be significantly smaller than a conventional active pixel sensor cell.

In addition, because only MOS compatible structures are utilized, the present invention is easily integratable with standard CMOS fabrication processes such as twin tub, single poly, and single metal.

It should be understood that various alternatives to the embodiment of the invention described herein may be employed in practicing the invention. For example, although the operation of the present invention has been described with respect to an n+ region and n-well formed in a p-type substrate, a p+ region and a p-well formed in an n-type substrate may alternately be used.

Thus, it is intended that the following claims define the scope of the invention and that methods and structures within the scope of these claims and their equivalents be covered thereby.

What is claimed is:

1. A row of active pixel sensor cells formed in a semiconductor substrate of a first conductivity type, the row of cells comprising:

a reset region of a second conductivity type formed in the substrate;

a plurality of spaced-apart photodiode regions of the second conductivity type formed in the substrate, the first photodiode region of the plurality of photodiode regions being formed a distance apart from the reset region, the junctions between each photodiode region and the substrate forming a photodiode;

a first parasitic channel region defined between the reset region and the first photodiode region;

a plurality of second parasitic channel regions defined between the photodiode regions such that a second parasitic channel region is defined between each pair of adjacent photodiode regions;

a layer of insulation material formed over the first parasitic channel region and the second parasitic channel regions;

a plurality of reset gates formed over the layer of insulation material such that a reset gate is formed over the first parasitic channel region and a reset gate is formed over each second parasitic channel region;

a reset line that contacts each of the reset gates; and a plurality of sense transistors corresponding to the plurality of photodiode regions, each sense transistor having a gate connected to a corresponding photodiode region.

2. The row of active pixel sensor cells of claim 1 and further comprising a plurality of row select transistors, each row select transistor being connected in series to a corresponding sense transistor.

3. The row of active pixel sensor cells of claim 1 and further comprising a plurality of contact regions of the second conductivity type, each contact region being formed in a corresponding photodiode region, wherein the dose of each contact region is greater than the dose of the corresponding photodiode region.

4. The row of active pixel sensor cells of claim 1 wherein the photodiode regions are wells.

5. The row of active pixel sensor cells of claim 1 wherein the layer of insulation material includes gate oxide.

6. A method for converting light energy into a plurality of pixel signals with a corresponding plurality of active pixel sensor cells formed in a semiconductor substrate of a first conductivity type, wherein the plurality of active pixel sensor cells include:

a reset region of a second conductivity type formed in the substrate;

a plurality of spaced-apart photodiode regions of the second conductivity type formed in the substrate, each photodiode region accumulating photogenerated electrons for a single pixel during an integration period, the first photodiode region of the plurality of photodiode regions being formed a distance apart from the reset region;

a first parasitic channel region defined between the reset region and the first photodiode region;

a plurality of second parasitic channel regions defined between the photodiode regions such that a second parasitic channel region is defined between each pair of adjacent photodiode regions;

a layer of insulation material formed over the first parasitic channel region and the second parasitic channel regions;

a plurality of reset gates formed over the layer of insulation material such that a reset gate is formed over the first parasitic channel region and a reset gate is formed over each second parasitic channel region;

a reset line that contacts each of the reset gates;

a plurality of sense transistors corresponding to the plurality of photodiode regions, each sense transistor having a gate connected to a corresponding photodiode region; and a plurality of row select transistors corresponding to the plurality of sense transistors, each row select transistor being connected to a corresponding sense transistor;

the method comprising the steps of:

applying a first voltage to the substrate;

resetting each of the plurality of photodiode regions to a preintegration voltage which reverse biases each of the substrate to photodiode region junctions;

collecting photogenerated electrons in each of the photodiode regions, the photogenerated electrons in each photodiode region changing the preintegration voltage to a post integration voltage; and applying a read voltage to the gates of each of the row select transistors an integration time after the photodiode regions are reset.

7. The method of claim 6 wherein the resetting step includes the steps of:

applying a second voltage to the reset region for a predefined time, wherein the second voltage is greater than the first voltage; and applying a third voltage to each of the reset gates to form conductive channels in each of the second parasitic channel regions.

8. The method of claim 7 wherein the second voltage and the third voltage are equal.

9. The method of claim 7 wherein the third voltage is a charge-pumped voltage.

\* \* \* \* \*